US006462482B1

United States Patent
Wickramanayaka et al.

(10) Patent No.: US 6,462,482 B1
(45) Date of Patent: Oct. 8, 2002

(54) PLASMA PROCESSING SYSTEM FOR SPUTTER DEPOSITION APPLICATIONS

(75) Inventors: Sunil Wickramanayaka, Tama; Yukito Nakagawa, Tachikawa, both of (JP)

(73) Assignee: Anelva Corporation, Tokyo (JP)

( * ) Notice: Subject to any disclaimer, the term of this patent is extended or adjusted under 35 U.S.C. 154(b) by 0 days.

(21) Appl. No.: 09/716,414

(22) Filed: Nov. 21, 2000

(30) Foreign Application Priority Data

Dec. 2, 1999 (JP) .......................................... 11-343334

(51) Int. Cl.[7] ................................................ H01J 7/24
(52) U.S. Cl. ............................. 315/111.21; 118/723 E
(58) Field of Search ................... 315/111.21, 111.41, 315/111.51, 111.71; 156/345; 204/192.1, 192.11, 192.12, 192.32, 298.01, 298.04; 118/723 E, 723 MA

(56) References Cited

U.S. PATENT DOCUMENTS 6,216,632 B1 * 4/2001 Wickramanayaka .... 118/723 E
6,228,236 B1 * 5/2001 Rosenstein et al. ..... 204/192.12

* cited by examiner

Primary Examiner—Don Wong
Assistant Examiner—Thuy Vinh Tran
(74) Attorney, Agent, or Firm—Oliff & Berridge, PLC

(57) ABSTRACT

A plasma processing system for sputter deposition application is configured by a reactor including two parallel capacitively-coupled electrodes called upper and lower electrodes, and a multi-pole magnet arrangement over the outer region of the upper electrode. The magnets are assembled on a metal ring in order to rotate over the upper electrode. The target plate is fixed to the upper electrode which is given only a high-frequency rf current, or high-frequency rf current and a DC voltage together. The lower electrode where the substrate is placed, is given a MF, HF or VHF rf current in order to generate a negative self bias voltage on the lower electrode to extract ionized sputtered-atoms that fill contact-holes on the substrate surface.

13 Claims, 11 Drawing Sheets

PLASMA PROCESSING SYSTEM FOR SPUTTER DEPOSITION APPLICATIONS

BACKGROUND OF THE INVENTION

1. Field of the Invention

The present invention relates to a plasma processing system for sputter deposition applications, and more particularly, to a plasma processing system like a plasma assisted sputtering system having an improved plasma source capable of independently controlling plasma ion density and ion energy at the rf (high-frequency AC) electrodes useful for a sputtering process of metal or dielectric materials during the fabrication of integrated circuits in the semiconductor industry.

2. Description of the Related Art

Large-area and high-density plasma sources with higher radial uniformity are of great demand to process large area substrates without charge-induced damages to the devices fabricated on the substrate surface. Specially, development of new plasma sources for the sputtering process of metal and dielectric materials with enhanced uniformity of the deposited film is of important. Difficulties in obtaining the above-mentioned properties with conventional plasma sources are explained using two conventional configurations as shown in FIGS. 10–13, which are usually applied in 200 mm wafer or flat panel plasma processing systems.

FIG. 10 shows a simplified conventional magnetron-type plasma source that uses for sputter deposition applications in semiconductor industry. A reactor 101 is comprised of an upper electrode 102 made of a non-magnetic metal, a cylindrical side wall 103 and a lower electrode 104. The upper electrode 102 forms a top plate of the reactor 101 and the lower electrode 104 is arranged on a bottom plate 105 of the reactor 101. The upper electrode 102 and the lower electrode 104 are parallel to each other across at least over a portion of the reactor 101. The side wall 103 and the bottom plate 105 are made of a metal, for example stainless steel. The upper part of the side wall 103 is made of an insulating material 106 on which the upper electrode 102 is placed. A target plate 107 made of a material needed to be sputtered is fixed to the lower surface of the upper electrode 102. Usually, the target plate 107 has slightly smaller dimensions in comparison with the upper electrode 102. On the upper surface of the upper electrode 102 as the top plate, two magnets 108a and 108b of circular and ring shapes are concentrically placed as shown in FIGS. 10 and 11. The central magnet 108a is of a cylindrical shape without any cavity as shown in FIG. 11. The outer magnet 108b is of a ring shape. The height and widths of each of the magnets 108a and 108b are not critical and selected according to the other dimensions of the reactor 101. The magnets 108a and 108b are placed on the upper electrode 102 so as to have opposite polarities facing the inside of the reactor 101. This arrangement of the magnets 108a and 108b generates curved magnetic fields 109 between these two magnets.

The upper electrode 102 is connected to a high-frequency AC (rf) electric power source 110 through a matching circuit 111. The frequency of the rf electric power source 110 is usually 13.56 MHz. When a rf electric power is applied to the upper electrode 102, plasma is generated by the capacitively-coupled mechanism. Once the plasma is made, electrons in the plasma are confined within the curved magnetic fields causing an increase of plasma density in that region.

A substrate 112 is placed on the lower electrode 104 electrically isolated from the bottom plate 105 through an insulating material 113. The lower electrode 104 may or may not be given a rf electric power from a rf power source. If a rf electric power is supplied to the lower electrode 104 by a rf electric power source 114 through a matching circuit 115, as shown in FIG. 10, the frequency of the rf electric power source 114 usually lies in MF region. When a rf current is applied to the lower electrode 104, it gets negatively biased causing an ion bombardment onto the surface of the substrate 112. Though the ion bombardment causes an etching process on films deposited on the substrate 112, the self-bias voltage of the lower electrode 104 is controlled so that the film deposition rate exceeds the film etching rate on the substrate 112.

Another conventional magnetron type sputtering source shown in FIG. 12 is a slight modification of the above-mentioned plasma source given in FIG. 10. Here the central magnet 108a is placed in an off-axis mode in order to form an asymmetric magnetic field below the upper electrode 102. A top view of this magnet arrangement is shown in FIG. 13. This magnetic configuration is rotated around a central axis (shown as a dashed line 116 in FIG. 12) of the upper electrode 102. The magnet arrangement formed by the magnets 108a and 108b shown in FIGS. 12 and 13 rotates asymmetrically.

The parallel plate plasma reactor shown in FIG. 10 has several advantages such as large area plasma between the parallel electrodes, readily ignition of the plasma, and the ability of controlling plasma ion energy at the lower electrode surface. With the magnet arrangement given in FIG. 10, a doughnut-shaped curved magnetic field is generated below the upper electrode 102. Once the plasma is ignited, higher-density plasma of the doughnut-shaped is formed below the upper electrode 102 due to the magnetic confinement of electrons. Since this higher-density plasma is mainly confined within the region between the magnetic poles of the magnets 108a and 108b, there is a lower plasma density in the vicinity of the magnetic. poles.

Further, the strength of the magnetic field increases toward the magnetic poles. This causes a mirror reflection of the electrons that result in lower electron density at the magnetic poles of the magnets 108a and 108b. When the electron density is low, the ion density is also gets low since ions are trapped in the plasma by electrostatic fields generated by electrons.

Because of the two reasons explained above, the ion flux at the magnetic poles gets smaller to result in a lower sputtering rate. However, since there is a higher-density plasma in the doughnut-shape region between the respective magnetic poles of the magnets 108a and 108b, the area of the target plate 107 corresponding to the region between the two magnets gets strongly sputtered. A fraction of these sputtered atoms are reflected back due to the scattering by gas molecules and deposited again on the target plate 107. Since the sputtering rate at the places of the target plate surface corresponding to the magnetic poles is relatively smaller, deposition of the sputtered atoms at these places gets dominant. The re-deposited film, however, has a lower density and stick loosely on the target plate 107, thus it can be easily released as particles.

In order to avoid the re-deposition of sputtered materials on the target plate 107, as shown in FIG. 12, the magnets 108a and 108b are placed asymmetrically and rotated around the central axis 116 of the upper electrode 102. Even though there is the re-deposition of sputtered materials at the places corresponding to the magnetic poles, the re-deposited films are immediately sputtered back into the plasma due to the rotation of the magnets. Accordingly, the source of particles in the plasma can be eliminated.

However, the plasma generated with the configuration given in FIG. 12 is radially non-uniform. This causes a non-uniform ion flux onto the surface of the substrate 112. This may cause localized charge build up on the substrate surface, specially if the substrate 112 is negatively biased by applying the rf electric power to the lower electrode 104, which eventually results in electrical breakdown of sub-micro scale elements on the substrate 107.

SUMMARY OF THE INVENTION

An object of the present invention is to provide a magnetically enhanced capacitively-coupled plasma processing system for sputter deposition applications with higher ion concentration, higher ion flux uniformity on the substrate surface and without the re-deposition of sputtered materials back on the target plate.

A plasma processing system of the present invention has the following structures in order to attain the above-mentioned object.

A plasma processing system for sputter deposition applications in accordance with the present invention has a reactor including parallel capacitively-coupled upper and lower electrodes facing each other across at least a portion of the reactor. A substrate to be processed is loaded on the lower electrode and a target plate to be sputtered by plasma is arranged at an inner (lower) side of the upper electrode. Further, the plasma processing system has high-frequency AC electric power sources for respectively supplying AC electric power to the upper electrode and/or the lower electrode. The AC electric power source for the upper electrode preferably operates at HF or VHF region. The AC electric power source for the lower electrode preferably operates at MF, HF or VHF region. Plural magnets are arranged radially in outer region of the upper electrode, and they are preferably rotated by a predetermined mechanism around a central axis of the upper electrode.

In the above-mentioned plasma processing system, preferably, an additional DC electric power source is connected to the upper electrode via a low-pass filter that cut off an AC current applied to the upper electrode.

In the above-mentioned plasma processing systems, preferably, the upper electrode is made of a non-magnetic metal, and the magnets generate magnetic fields with closed magnetic fluxes near to the inner surface of the upper electrode by changing a magnetic polarity of the magnets facing the inside of the reactor alternately.

In the above-mentioned plasma processing systems, preferably, other plural magnets are arranged along a circular line surrounding the radially-arranged magnets in order to confine electrons in a peripheral region of plasma.

In the above-mentioned plasma processing systems, preferably, the radially-arranged magnet with N porality facing the inside of reactor and the other magnet arranged along the circular line are lined up in series.

In the above-mentioned plasma processing systems, preferably, the magnets include first magnets with N polarity facing the inside of the reactor, which are of curved shape extending to the boundary of the upper electrode, and second magnets with S polarity facing the inside of the reactor, which are of straight shape, and the first magnets and the second magnets are alternately arranged so that electrons in the plasma within a magnetic line cusp between the first and second magnets are moved radially outward due to E×B drift and then curved and drifted radially inward through the magnetic line cusp.

In the above-mentioned plasma processing systems, preferably, the first magnet with either S or N polarity is longer than the second magnet with S polarity.

In the above-mentioned plasma processing systems, preferably, the magnets include first magnets with S polarity facing the inside of the reactor, which are of curved shape extending to the boundary of the upper electrode, and second magnets with N polarity facing the inside of the reactor, which are of straight shape, and the first magnets and the second magnets are alternately arranged so that electrons in the plasma within a magnetic line cusp between the first and second magnets are moved radially outward due to E×B drift and then curved and drifted radially inward through the magnetic line cusp.

In the above-mentioned plasma processing systems, preferably, the first magnet with S polarity is longer than the second magnet with N polarity.

In the above-mentioned plasma processing systems, preferably, the plural magnets are assembled on a circular metal ring to have a small separation between the upper electrode and the magnets.

In the above-mentioned plasma processing systems, preferably, the plural magnets are placed directly on the upper electrode.

In the above-mentioned plasma processing systems, preferably, each of the magnets is made as a single piece.

In the above-mentioned plasma processing systems, preferably, each of the magnets is consisted of several magnet elements.

In the above-mentioned plasma processing systems, preferably, width of each of the magnets existing on the radial line is varied in radial direction.

DESCRIPTION OF THE PREFFERED EMBODIMENTS

Hereinafter, preferred embodiments will be explained according to attached drawings. Through the explanation of the embodiments, the details of the present inventions will be clarified.

Figure 1:
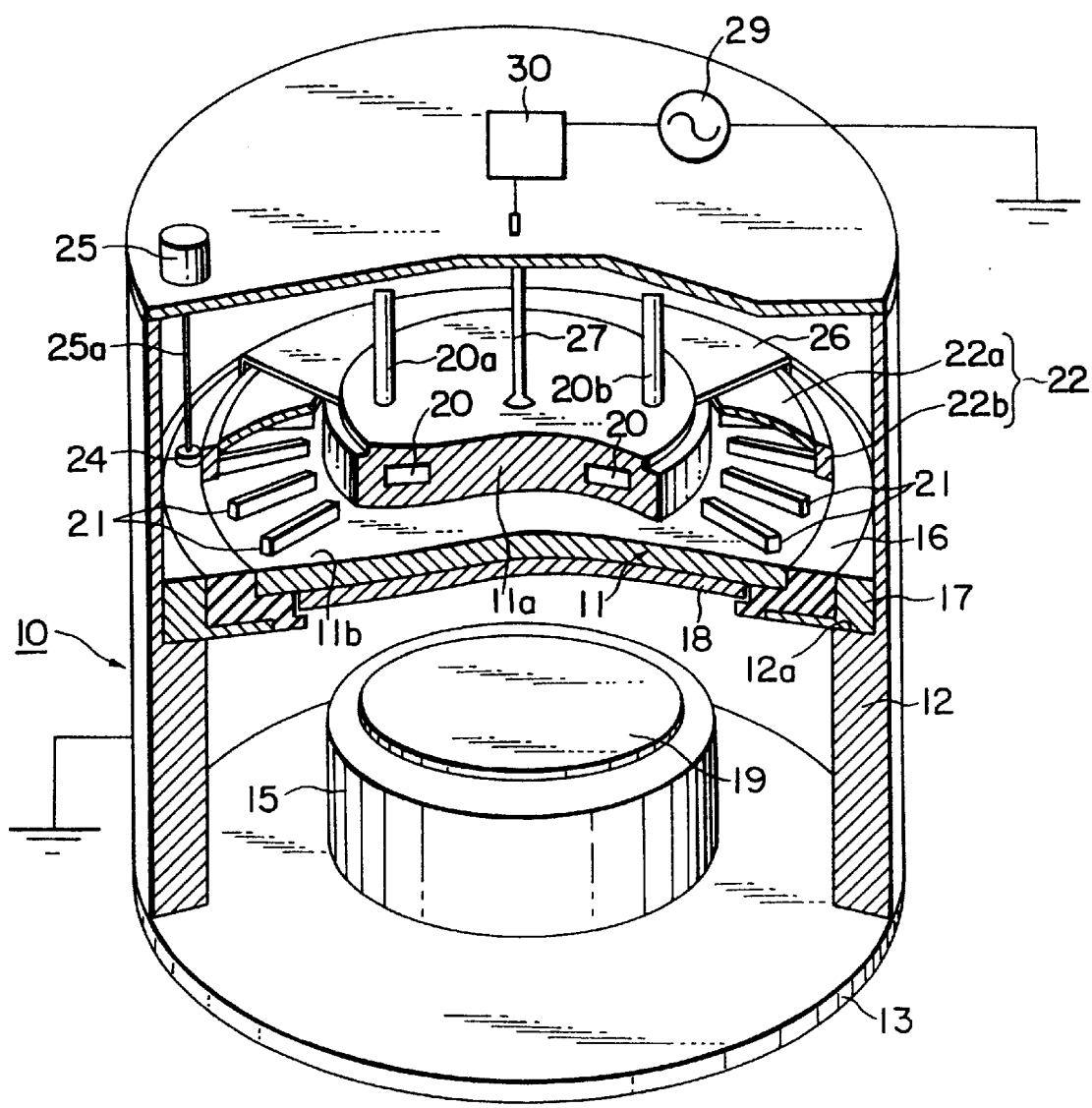
FIG. 1 is a perspective view of the first embodiment showing the capacitively-coupled electrodes, a target plate and a magnet arrangement.
Figure 2:
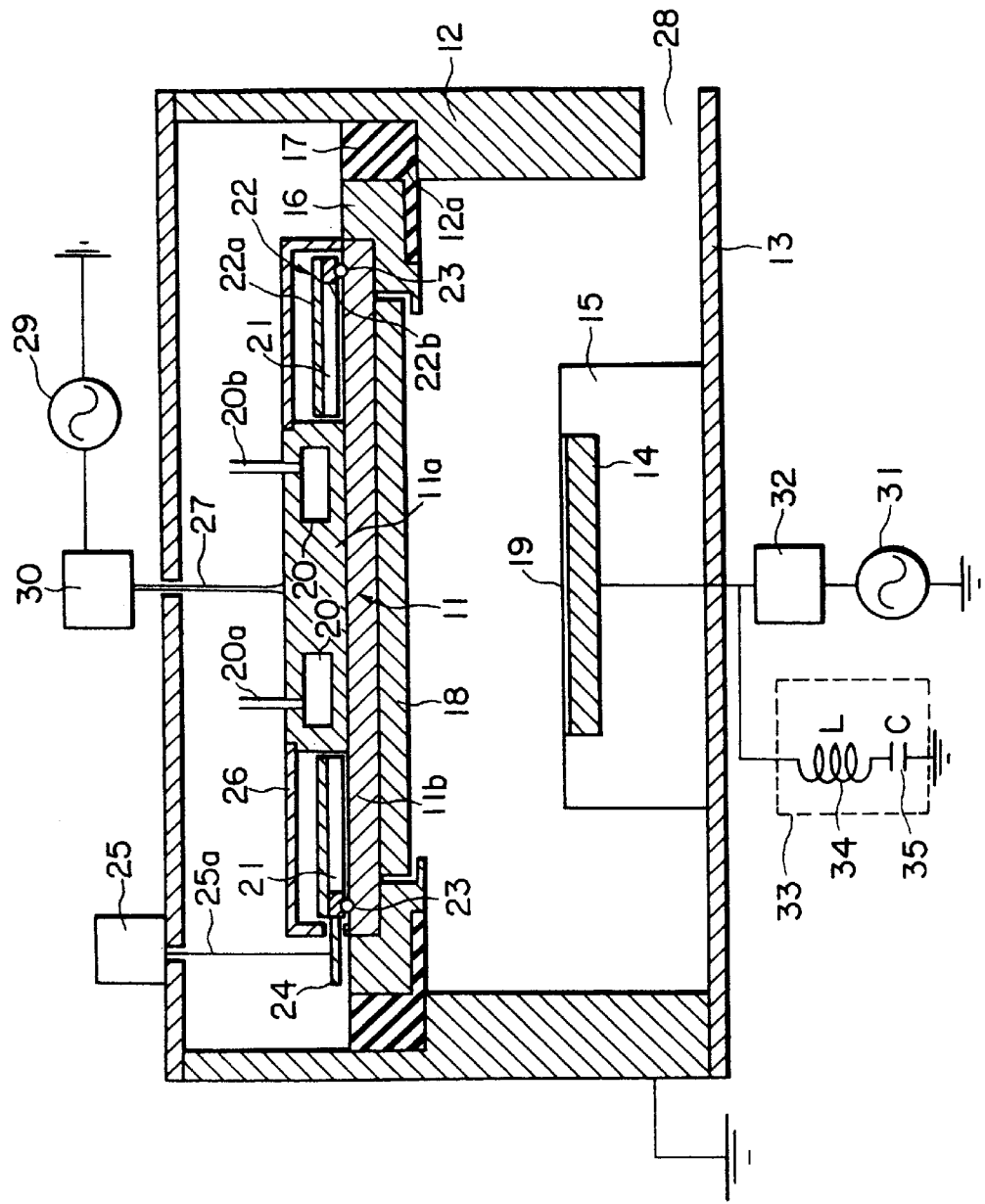
FIG. 2 is a longitudinal sectional view of the first embodiment.

The first embodiment of the present invention will be explained in accordance with FIGS. 1 and 2. FIGS. 1 and 2 show views of a plasma source used for a plasma processing system of the first embodiment. In this plasma processing system, 10 designates a reactor, 11 designates an upper electrode, 12 designates a cylindrical sidewall, 13 designates a bottom plate, 14 designates a lower electrode, and 15 designates a substrate holder. The upper electrode 11 is made of a non-magnetic metal, for example, Al, and placed on a ring 16 made of a dielectric material, for example, ceramic. The upper electrode 11 is of a circular shape. The dimensions of the upper electrode 11 are not critical and depend on the size of a substrate to be processed. The cylindrical side wall 12 and the bottom plate 13 are both made of a metal and electrically grounded.

The dielectric ring 16 is supported by a ring metal supporter 17 which is arranged on an inside step section 12a of the side wall 12. A target plate 18 of a round shape is fixed to a lower surface of the upper electrode 11 without forming any voids between the upper electrode 11 and the target plate 18. The lower surface of the target plate 18 faces a substrate 19 loaded on the substrate holder 15 with a space.

The outer (or peripheral) part 11b of the upper electrode 11 becomes thinner than the central part 11a thereof. The thickness of the outer part 11b is taken as small as possible in order to make available magnetic fields at the inner space of the reactor 10 but to withstand the differential pressure between outside and inside of the reactor 10. The central part 11a of the upper electrode 11 has a required thickness in order to make canals 20 through the upper electrode 11. A coolant introduced through a coolant inlet 20a flows in the canals 20 of the central part 11a to cool the upper electrode 11 and flows out through a coolant outlet 20b. The diameter of the thicker central part 11a is taken as large as possible in order to perform efficient cooling of the upper electrode 11. The cooling process of the upper electrode 11 is important since the upper electrode 11 and the target plate 18 get heated during the operation due to the higher energetic ion flux onto the target plate 18.

The target plate 18 is made of a material to be sputtered, for example, Ti, TiN or $SiO_2$. The diameter of the target plate 18 is slightly smaller than the diameter of the upper electrode 11. The thickness of the target plate 18 is usually in the range of 5 mm to 10 mm.

The innermost edge of the dielectric ring 16 on which the upper electrode 11 is placed is extended to cover the edge of the target plate 18 as shown in FIGS. 1 and 2. There is a small separation, usually about 1–3 mm, between the extended part of the dielectric ring 16 and the target plate 18. This innermost edge of the dielectric ring 16 is called as a shielding ring. Even though the dielectric ring 16 is modified to form the shielding ring in the first embodiment, one can use other different shielding rings with different suitable configuration.

Plural magnets 21 are arranged at the upper (or outer) side of the upper electrode 11 in a ring-shaped region around the central part 11a at regular intervals. Each of the magnets 21 has a rod-shape, for example, and all of the magnets 21 are placed to be along (or on) a radial direction of the upper electrode 11. Namely, the plural magnets 21 are arranged radially at the outer side of the electrode 11. The vertical cross sectional shape of the magnet 21 is preferably square or rectangular shape. The cross sectional dimensions of the magnet 21 are not critical and can be varied in a wide range, for example, in the region of 5×5 mm to 30×30 mm. The length of the magnet 21 is also not critical. Usually the length of the magnet is determined experimentally. Once process parameters, such as pressure and rf power etc., are decided, the length of the magnets 21 is changed until a uniform plasma density at the level of substrate stage in the substrate holder 15 is given. In addition, the magnet 21 with a predetermined length may be formed by assembled magnetic elements.

The magnets 21 are arranged with alternate polarity (N-type or S-type) to form closed magnetic flux between neighboring magnets. In this case, the N-type magnet means a magnet with a N polarity facing the inside of the reactor 10 and the S-type magnet means a magnet with a S polarity facing the inside of the reactor 10. This closed magnetic flux passes below the lower surface of the target plate 18. The upper surface of the magnet 21 is attached to a metal ring 22a that is usually made of soft iron, as shown in FIG. 2. The outer edge of the metal ring 22a is fixed to another metal (or dielectric) ring 22b that is placed on ball bearings 23 for smooth rotation over the upper electrode 11. The metal rings 22a and 22b form a member 22 for supporting the plural radial rod-shape magnets 21. Thus, the plural magnets 21 are assembled on the circular metal ring 22a of the support member 22 with a small separation between the upper electrode 11 and the magnets 21. One point of the outer region of the metal ring 22a is in contact with a rubber roller 24 that can be rotated by a motor 25. 25a designates a power transmission shaft. Accordingly, by supplying an electric power to the motor 25, a multi-poles magnets arrangement formed by the magnets 21 can be rotated with a rotation frequency <0.5 Hz, for example. By controlling the electric power given to the motor 25, the rotation speed of the multi-poles magnets arrangement can be varied. Thus, the magnets 21 can be rotated by the rotation of the support member 22. In the above-mentioned structure, the plural magnets 21 may be placed directly on the upper electrode 11. In this case, in order to rotate the magnets 21, the plasma processing system has a mechanism to rotate the upper electrode 11.

A cover plate 26 made of a metal, such as aluminum usually, is placed to cover the plural magnets 21 above the upper electrode 11. The cover plate 26 is tightly fixed to the upper and outermost edge of the upper electrode 11. When a HF or VHF current is applied to the center part 11a of the upper electrode 11 through a metal conductor 27, it flows over the surface of the cover plate 26 and enters the lower surface of the upper electrode 11 (or the target plate 18). Thus the conduction of HF or VHF current over the surface of magnets 21 is avoided. This eliminates possible heating of the magnets 21 and electrical sparking between the magnet 21 and the upper electrode 11. However, use of the cover plate 26 is not essential for the plasma source of the present invention.

A process gas (preferably Ar) is fed to the reactor 10 through gas inlet ports (not shown) made in the cylindrical side wall 12. The inner pressure of the reactor 10 is controlled by means of adjusting a gas flow rate and a well-known variable orifice (not shown) placed at a gas outlet port 28. The inner pressure of the reactor 10 may be varied from 1 mTorr to 100 mTorr depending on the type of the plasma process.

29 designates an AC (rf) electric power source for supplying the HF or VHF current to the central part 11a of the upper electrode 11 through a matching circuit 30. The frequency of the HF or VHF current supplied by the AC electric power source 29 lies in the range of about 10–100 MHz and the typical frequency in the range is 13.56 MHz or 60 MHz. The AC electric power source 29 usually has a low impedance, typically about 50 Ohms, and is capable of producing an rf electric power from 0.5 kW to 5 kW. The output of the AC electric power source 29 is fed to the upper electrode 11.

31 designates another AC (rf) electric power source for supplying the AC current to the lower electrode 14. The frequency of the AC current supplied by the second AC electric power source 31 preferably lies in the MF, HF or VHF regions. The AC electric power source 31 also has a low impedance, typically 50 Ohms, and is capable of producing the AC electric power up to 1 kW. This AC electric power is applied to the lower electrode 14 within the substrate holder 15 through a matching circuit 32. One end of a high-pass filter 33 comprised of an inductor 34 and a capacitor 35 connected in series, is connected to a transmission line between the lower electrode 14 and the matching circuit 32. The other end of the high-pass filter 33 is grounded. The purpose of using the high-pass filter 33 is to make a ground path for HF or VHF current coming from the lower electrode 14. This method protects the AC electric power source 31 from possible damages by the high-frequency AC currents.

The mechanism of plasma generation in the reactor 10 based on the above-mentioned plasma source will be explained. When the rf current operating at HF or VHF region is applied to the upper electrode 11 under the predetermined conditions, a plasma is generated by the mechanism of capacitively coupling of the rf electric power. In the regions where there are magnetic fields, electrons are subjected to cyclotron rotation. This increases the electron path length and thereby the number of collisions between gas molecules causing an increase of plasma density. Since the magnets 21 are arranged only at the outside region of the upper electrode 11, a doughnut-shaped high-density-plasma embedded in a relatively lower density plasma is made. The charged particles in the doughnut-shaped high-density-plasma then diffuse radially inward and outward while flowing into the downstream. Due to this diffusion process, a radially uniform plasma is formed in the downstream where the substrate 19 is placed. The distance to the radially uniform plasma from the target plate 18 is primarily determined by both the radius of the doughnut-shaped plasma and the plasma density. Since the radius of the doughnut-shaped plasma is determined by the inner and outer radii of the multipole magnet arrangement, the plasma uniformity at a desired level can be controlled by means of placing the magnets 21 in a suitable distance from the center of the upper electrode 11 or selecting the suitable length of the magnets 21.

Once the plasma is ignited, the upper electrode 11 gets negatively biased due to the fact that electrons have higher thermal velocity than ions. The self-bias voltage on the upper electrode 11 largely depends on the plasma excitation frequency. An increase of the plasma excitation frequency causes a decrease of the self-bias voltage and an increase of plasma density. The value of the negative bias voltage on the upper electrode 11 also depends on a ratio of the upper electrode surface area to an anode area. Here, the anode area is the total surface area of all grounded surfaces. Usually the anode area is larger than the upper electrode (cathode) surface area in most of the plasma source. This causes development of the negative self-bias voltage on the upper electrode 11. Owing to this negative self-bias voltage, the ions in the plasma accelerate toward the target plate 18 and causes the material making the target plate 18 to be sputtered into the plasma. In order to get a higher sputtering rate both the ion density and the self-bias voltage of the upper electrode 11 have to be increased. The increase of the rf electric power supplied from the AC electric power source 29 causes both the plasma ion density and the self-bias voltage to be increased.

The ionization rate of the atoms sputtered from the target plate 18 can be increased by an increase of the plasma density. Accordingly, an increase of the rf electric power applied to the upper electrode 11 results in an increase of the sputtering rate and the ionization of the sputtered atoms. The ionized atoms are then accelerated and collimated onto the surface of the substrate 19 by the bias potential generated on the lower electrode 14 due to the application of the AC (rf) current. If the rf current applied to the lower electrode 14 is in VHF region, a high density plasma is generated close to the lower electrode 14. This enhances the ionization rate of the sputtered atoms resulting in a higher deposition rate.

As explained in the prior art, similarly, the redeposition of the sputtered atoms at the places corresponding to the magnetic poles of the magnets 21 can be occurred with this magnetic arrangement. However, since the multipole magnet arrangement of this embodiment is rotated, the re-deposited film is immediately sputtered by the high-density plasma. In addition, the magnetic field lines (magnetic flux lines) generated with the magnetic arrangement lies to be perpendicular to the radial lines of the upper electrode 11, or the reactor 10. That is, there are no magnetic field lines in the radial direction of the reactor 10. Because of this reason, there are no magnetic field lines in the central region of the target plate 18. Thus, there is no mechanism for the repulsion of bombarding electrons on the target plate 18. Therefore, ions in the plasma bombard on the central region with the same energy as those bombard at the doughnut-shaped plasma region since the self-bias voltage on the target plate 18 is the same everywhere. However, the ion flux in the central region is lower as compared with the plasma generated below the multiple magnet arrangement. Therefore, the sputtering yielded in the central region is lower as compared with the outer region. This is a required condition in obtaining a uniform sputtered atom or ionized atom flux on the substrate surface.

Figure 3:
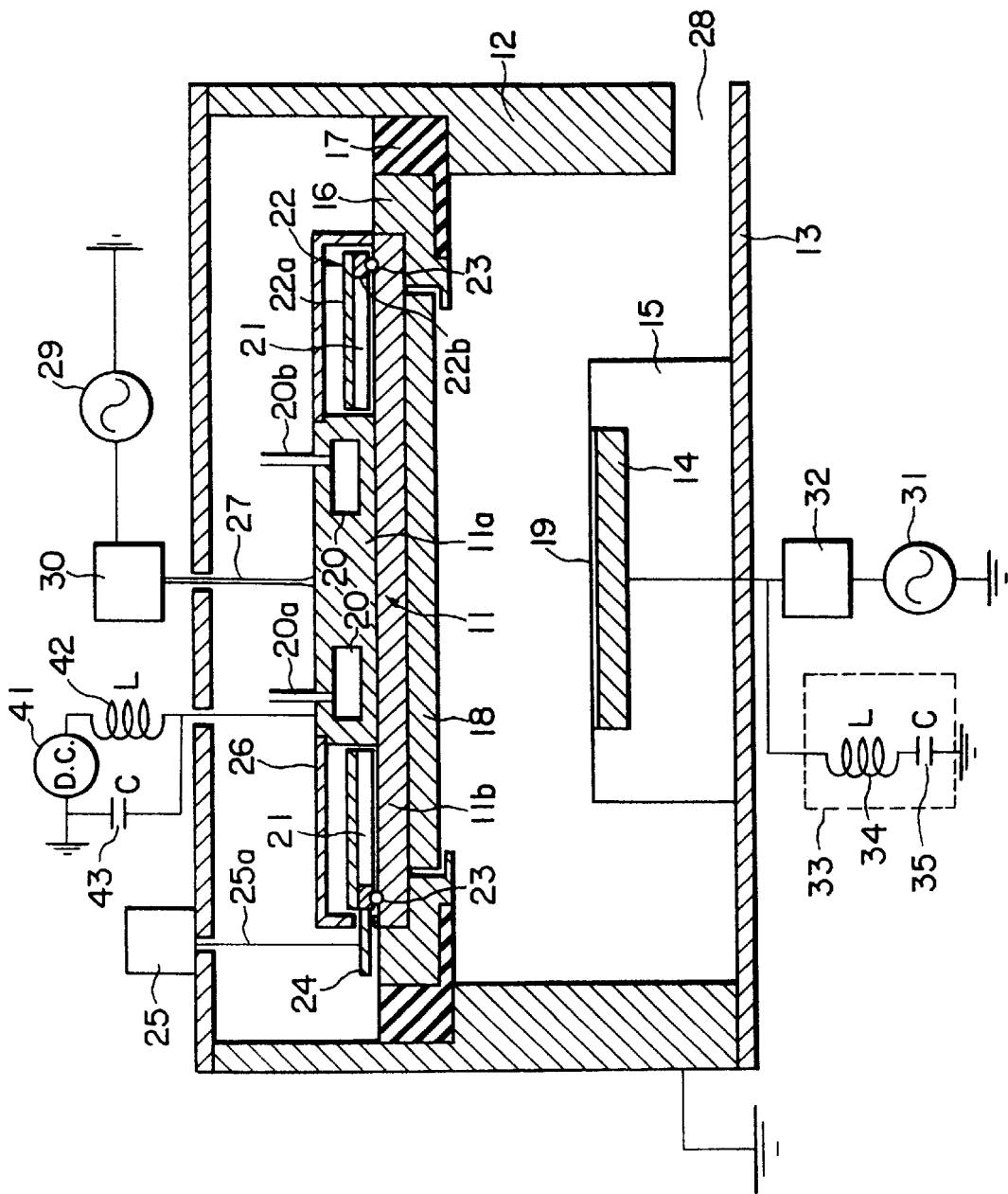
FIG. 3 is a longitudinal sectional view of the second embodiment.

Next, the second embodiment of the present invention is explained in accordance with FIG. 3. FIG. 3 shows a cross sectional view of the plasma processing system and is similar to FIG. 2. Except an additional DC bias supply configuration to the upper electrode, all the other configurations are the same as given in the first embodiment. Components shown in FIG. 2 substantially identical to those explained in the first embodiment are respectively designated by the same reference numerals.

The upper electrode 11 is connected to the AC electric power source 29 operating at HF or VHF region via the matching circuit 30 similar to the first embodiment. The specifications regarding the AC electric power source 29 and the like are the same as given in first embodiment. In addition, the upper electrode 11 is connected to a DC voltage supply source 41 through an inductor (L) 42. Further, one terminal of a capacitor (C) 43 is connected to a transmission line between the inductor 42 and the upper electrode 11 while another terminal of the capacitor 43 is grounded. The values of L and C are selected so that the rf current applied to the upper electrode 11 does not pass through. the DC voltage supply source 41. This electrical connection component protects the DC voltage supply source 41 from parasitic rf currents. The DC voltage supply source 41 is capable of delivering a voltage up to −1000 V.

The plasma is generated by the capacitively coupled mechanism and the plasma density at the outer region of the upper electrode 11 is enhanced by the magnetic field based on the plurality of the magnets 21 as explained in the first embodiment. The plasma density is controlled by the variation of applied rf electric power. The DC voltage supply source 41 is used to give a desired negative DC bias to the upper electrode 11 in order to accelerate ions onto the target plate 18. The ions gain higher energy through the acceleration process. This results in an increase of sputtering rate. Application of negative DC bias of the DC voltage supply source 41 onto the upper electrode 11 has no effect on the plasma potential. Accordingly, the ion density of the plasma and the bias voltage of the upper electrode 11 can be independently controlled with the configuration of the second embodiment.

Figure 4:
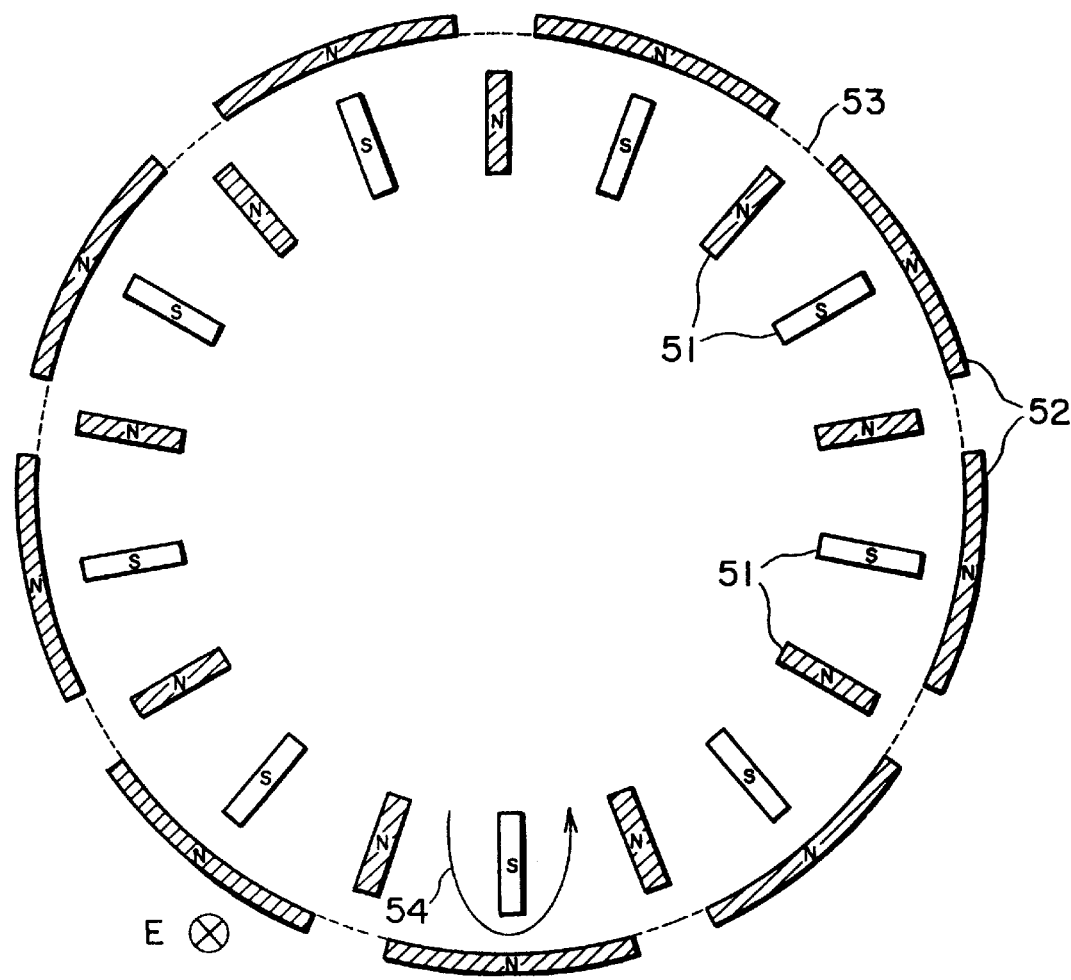
FIG. 4 shows a magnet arrangement used in the third embodiment.

Next, the third embodiment is explained in accordance with the FIG. 4. In the third embodiment, the main hardware configuration is the same as that of the above-mentioned embodiments. The third embodiment has a special feature in the respect of magnetic arrangement. Therefore, FIG. 4 shows only the magnetic arrangement formed by plural magnets (51 and 52) which are placed above the upper electrode 11. One set of the magnets 51 is arranged along radial lines with alternate polarity (N-type or S-type) similar to those of the above-mentioned embodiment. The magnets 51 with the N polarity facing the inside of the reactor and the magnets 51 with the S polarity facing the inside of the reactor are alternately arranged. The magnets 51 are substantially identical to the magnets 21. Another set of magnets 52 is arranged along circular line 53 whose diameter is approximately equal to the diameter of the upper electrode 11. Accordingly, the magnets 51 arranged along radial lines lie within the circle region defined by the magnets 52 arranged along the circular line 53 as shown in FIG. 4. The magnets 52 placed along the circular line 53 have the same polarity (N-pole, for example) toward the inside of the reactor 10. Further, each magnet 52 on the circular line 53 is arranged to be perpendicular to a magnet 51 on the radial line, which has opposite polarity (S-pole) facing the inside of the reactor 10. The length of the magnet (51, 52) or the separation between the magnets (51, 52) are not critical. The separation between two magnets 52 on the circular line 53 is usually taken as ½ of the length of the magnet 52. The length of the magnet 52 depends on the separation between two neighboring magnets 51 on radial lines. The magnet arrangement explained above is rotated similar to those of the first or the second embodiment.

Electrons in the vicinity of the upper electrode 11 are subjected to E×B drift where E and B are respectively the strengths of DC electric field and magnetic field at the upper electrode 11. Because of this E×B drift of electrons, a fraction of electrons are escaped from the upper electrode region if the magnetic arrangement given in the above-mentioned embodiments is used. When the magnets are arranged as in the third embodiment, electrons are confined properly within the upper electrode region. This magnetic arrangement is schematically shown in FIG. 4, as a typical arrangement, considering that the direction of electric field is toward the upper electrode and the polarity of magnets 51 and 52 are labeled as shown in FIG. 4. The direction of E×B drift in FIG. 4 is shown in arrowhead line 54. Owing to this electron confinement within the target plate region, the plasma density is further increased compared to that of obtained with the first and the second embodiments. Moreover, this magnet arrangement also does not cause any re-deposition of sputtered film on the target plate since the magnets 51 and 52 are rotated.

Figure 5:
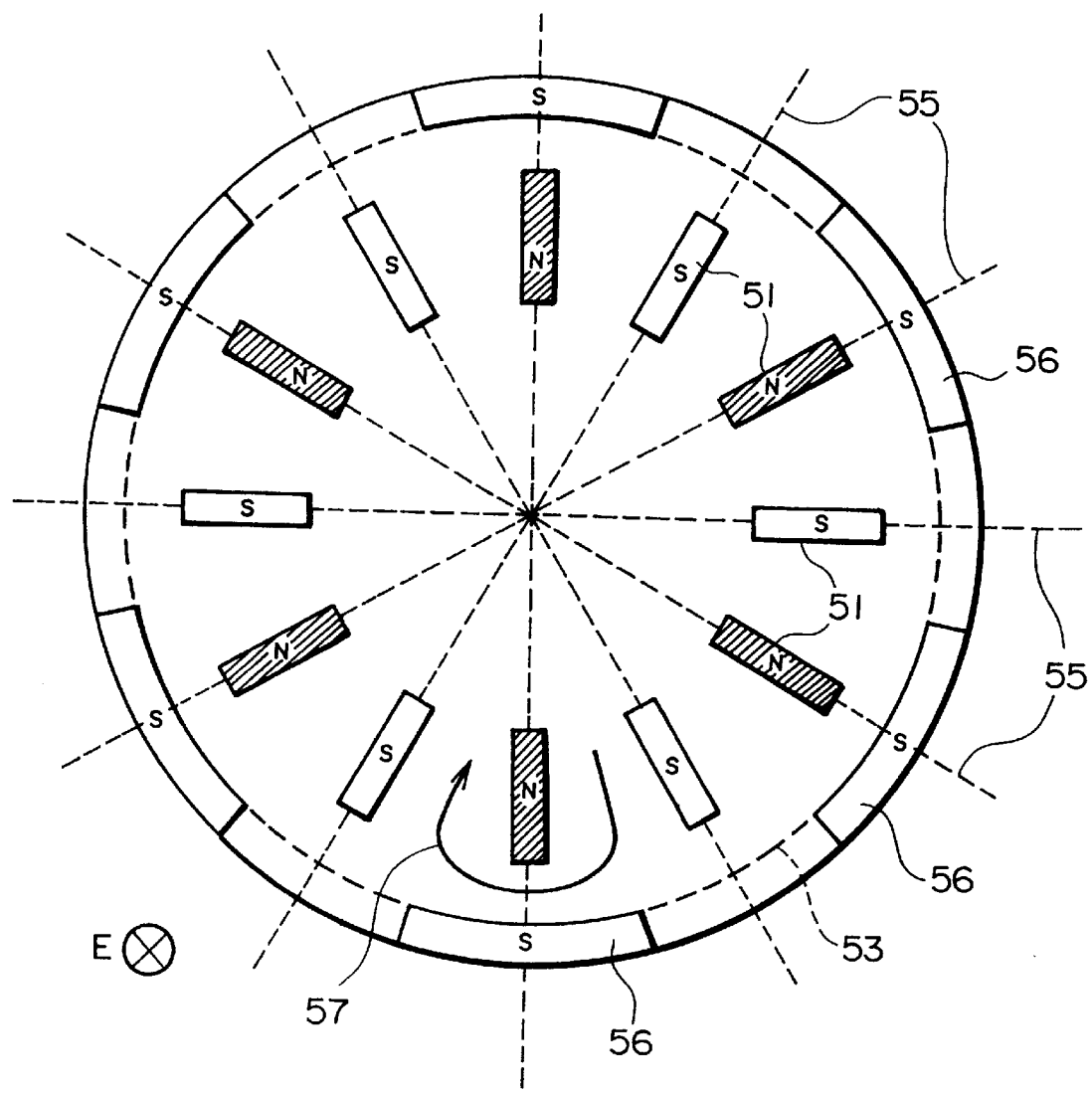
FIG. 5 shows another magnet arrangement used in the third embodiment.

FIG. 5 shows a modified example of the third working example shown in FIG. 4. In this modified example, as compared with the magnet arrangement of the third working example, the magnetic polarities are changed to be opposite. That is, as shown in FIG. 5, N-type and S-type magnets 51 are alternately arranged along radial lines 55. Further, plural magnets 56 with S polarity facing the inside of the reactor are arranged along circular line 53 whose diameter is approximately equal to the diameter of the upper electrode 11. The magnets 51 arranged along radial lines lie within the circle region defined by the S-type magnets 56 arranged along the circular line 53. Further, each magnet 56 along the circular line 53 is arranged to be perpendicular to the N-type magnet 51 on the radial line 55. The remained structure of this example is as same as the third working example. The arrowhead line 57 formed around N-type magnet 51 shows the direction of E×B drift based on the magnet arrangement of this example.

Figure 6:
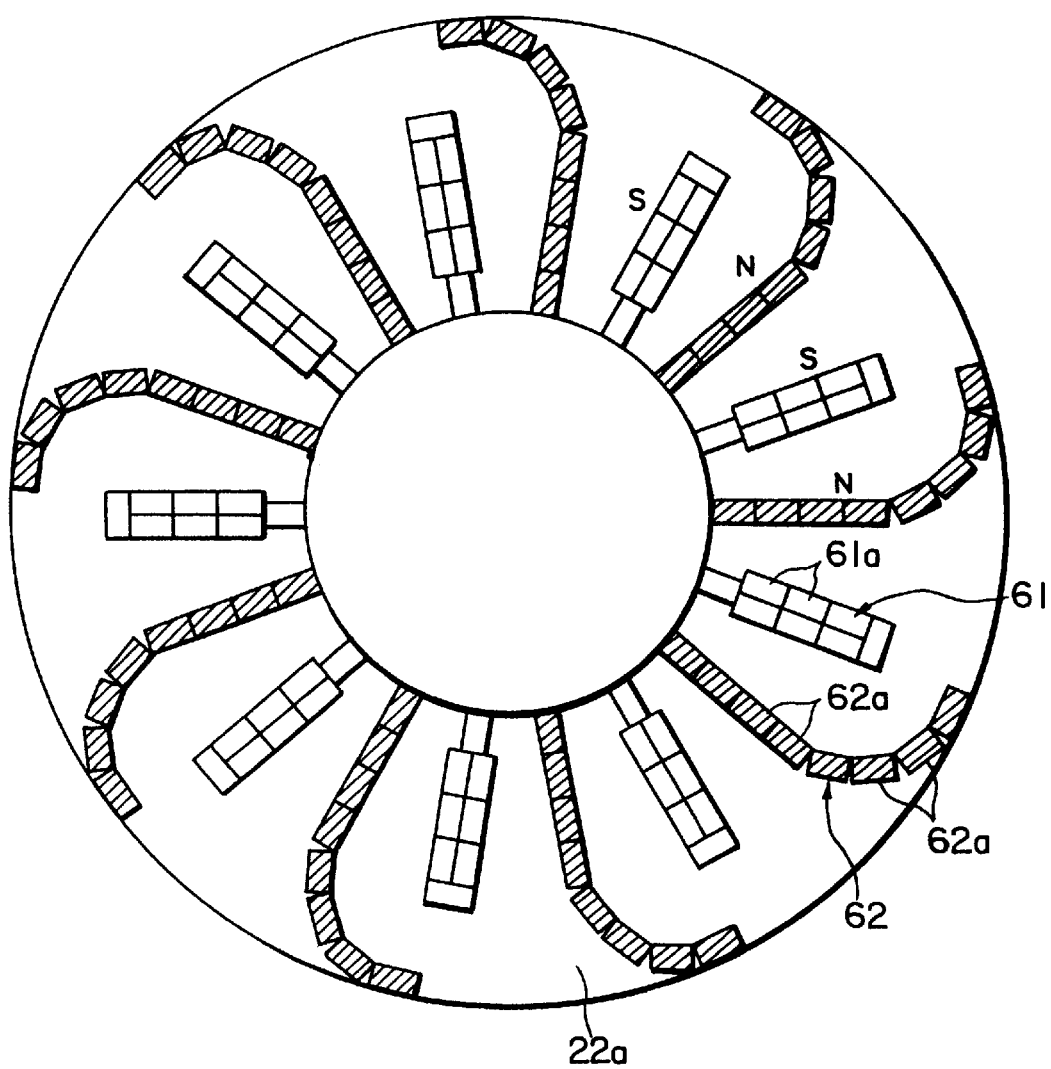
FIG. 6 shows a magnet arrangement used in the fourth embodiment.

FIG. 6 shows the fourth embodiment of the present invention. This embodiment is a modification of the magnetic arrangement of the third embodiment shown in FIG. 4 as a most practical structure. In this example, especially, the magnets forming N magnetic poles are modified. In FIG. 6, 61 designates a magnet assembly with S magnetic pole inside surface, 62 designates a magnet assembly with N magnetic pole inside surface, 22a designates the metal ring. The edge profile of the metal ring 22a is nearly consistent with the above-mentioned circular line 53. In accordance with the structure shown in FIG. 6, nine magnet assemblies 61 and 62 are radially arranged at regular intervals. The magnet assembly 61 of S-type is formed by several magnet elements 61a that are lined up as shown in FIG. 6 and corresponds to the S-type magnet 51 whose lower (inside) surface has S magnetic pole. The magnet assembly 62 of N-type is formed by several magnet elements 62a that are lined up in series as shown in FIG. 6 and corresponds to a combination of the radial-direction N-type magnet 51 with N magnetic pole inside surface and the magnet 52 along the circular line 53. The magnet assembly 62 includes a radial-direction part and a part along the circular line 53. The magnet assembly 62 with N polarity facing the inside of the reactor is of a straight shape extending to and a curved shape at the outer of the upper electrode or the outer end of the metal ring 22a. This magnetic arrangement formed by the magnet assemblies 61 and the magnet assemblies 62 functions in the same way as that explained in the third embodiment and has the same technical effect.

Figure 7:
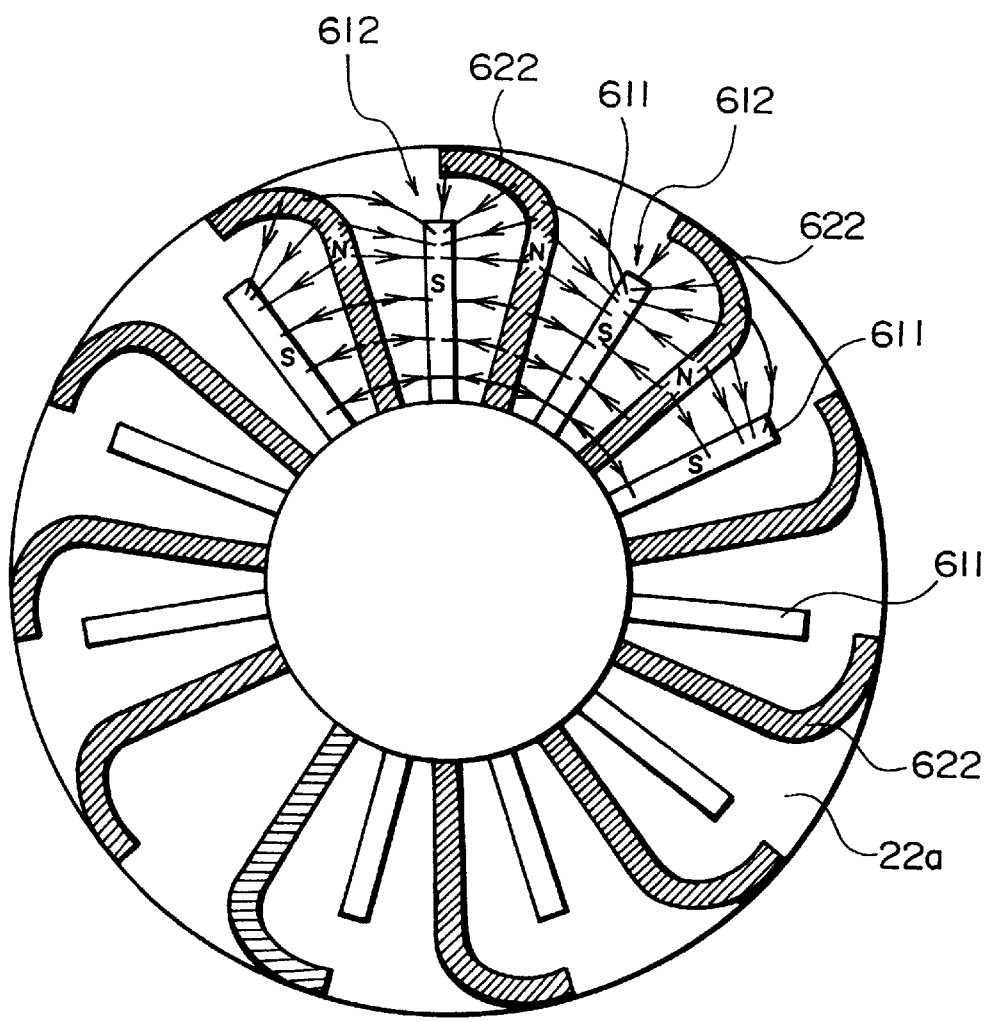
FIG. 7 shows another magnet arrangement used in the fourth embodiment.

FIG. 7 further shows a modification of the fourth embodiment of the present invention. In accordance with this modification of the fourth embodiment, the arrangement and the shape of the N-type and S-type magnets is substantially identical to the arrangement and the shape shown in FIG. 4. The magnets shown in FIG. 7 include the first magnets 622 with N polarity facing the inside of the reactor 10, which are of a curved shape extending to or at the boundary of the upper electrode 11 or the metal ring 22a, and the second magnets 611 with S polarity facing the inside of the reactor 10, which are of straight shape. The magnets 611 and 622 are alternately arranged so that electrons in the plasma within a magnetic line cusp 612 between the first and second magnets are moved radially outward due to E×B drift and then curved and drifted radially inward through the magnetic line cusp 612. As shown in FIG. 7, the first magnet 622 with N polarity is longer than the second magnet 611 with S polarity.

Figure 8:
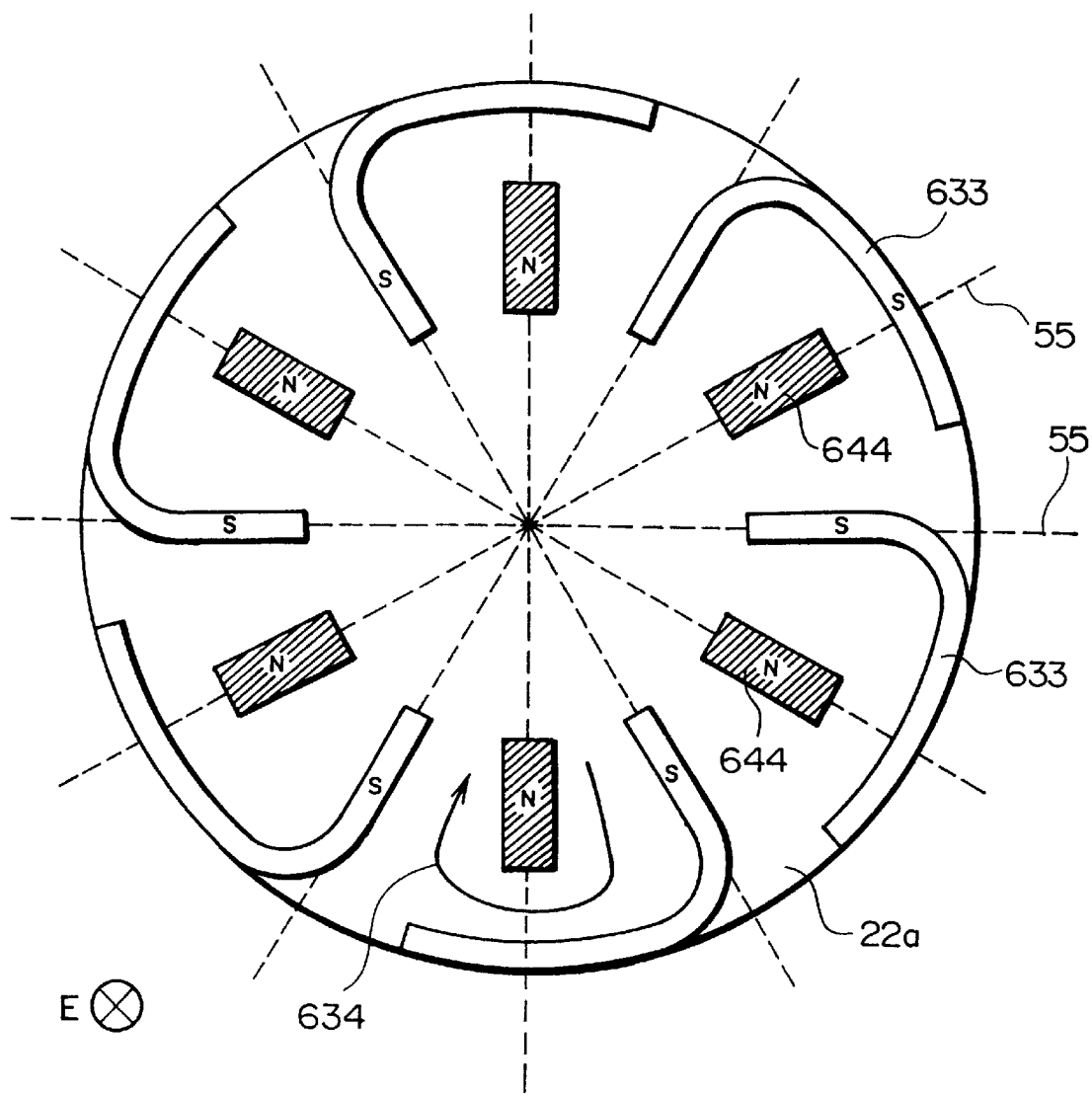
FIG. 8 shows another magnet arrangement used in the fourth embodiment.

FIG. 8 shows another modification of the fourth working example of the present invention. In accordance with this modification of the fourth working example, as compared with the modification shown in FIG. 7, the arrangement and shape of the N-type and S-type magnets are reversed. The magnets shown in FIG. 8 include the first magnets 633 with S polarity facing the inside of the reactor 10, which are of a curved shape extending to or at the boundary of the upper electrode 11 or the metal ring 22a, and the second magnets 644 with N polarity facing the inside of the reactor 10, which are of substantially straight shape. The magnets 633 and 644 are alternately arranged so that electrons in the plasma within a magnetic line cusp between the first and second magnets are moved radially outward due to E×B drift and then curved and drifted radially inward through the magnetic line cusp. The arrowhead line 634 shows the direction of E×B drift. As shown in FIG. 8, the magnet 633 with S polarity is longer than the magnet 644 with N polarity.

Figure 9:
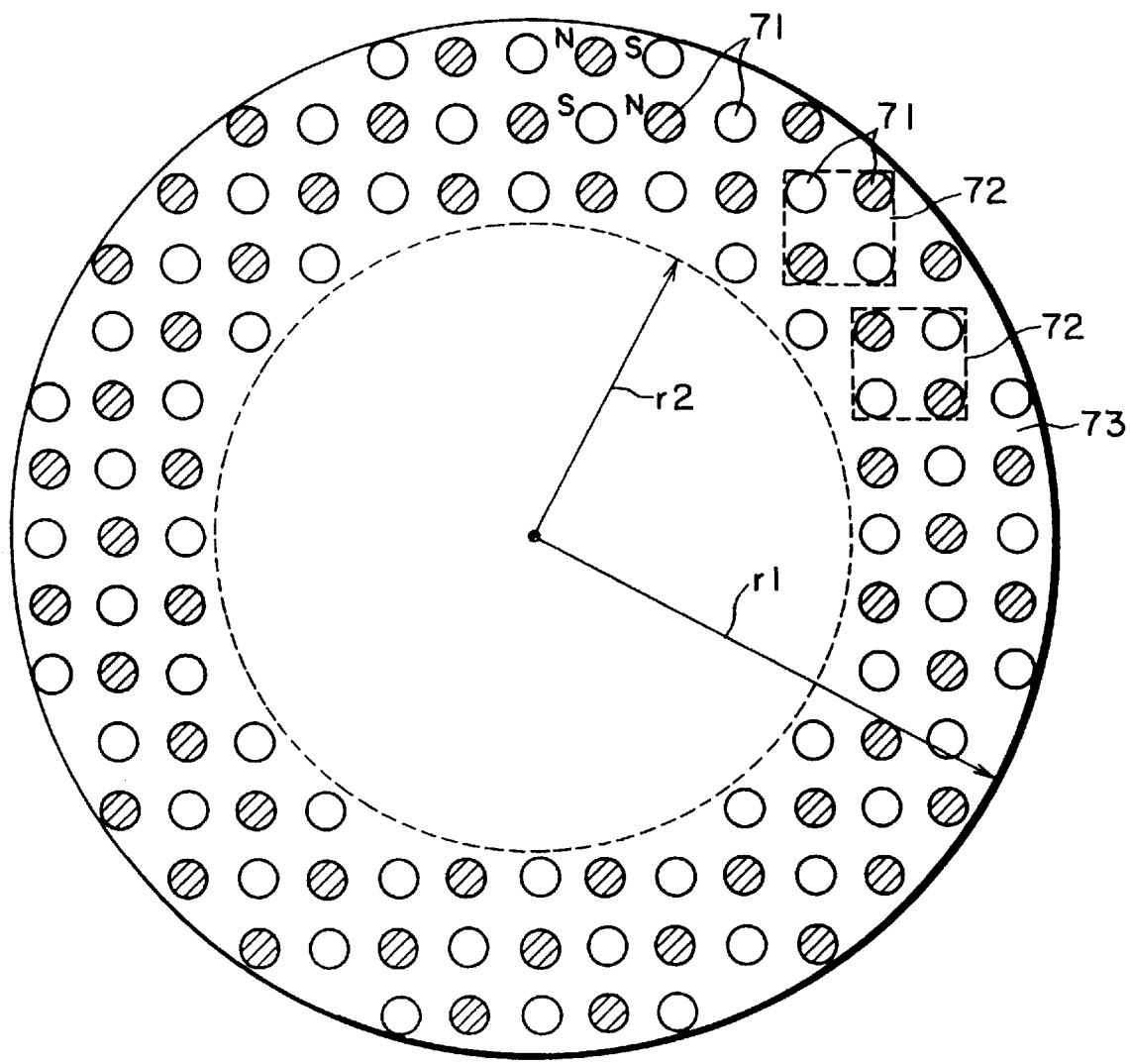
FIG. 9 shows a magnet arrangement used in the fifth embodiment.
Figure 10:
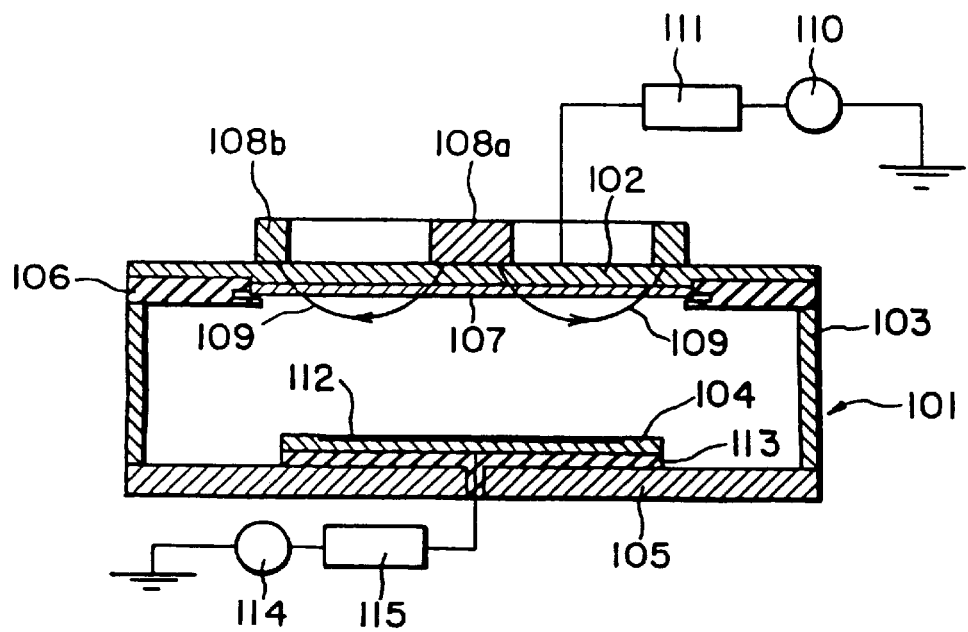
FIG. 10 is a schematic view showing the first conventional plasma source used for plasma processing.
Figure 11:
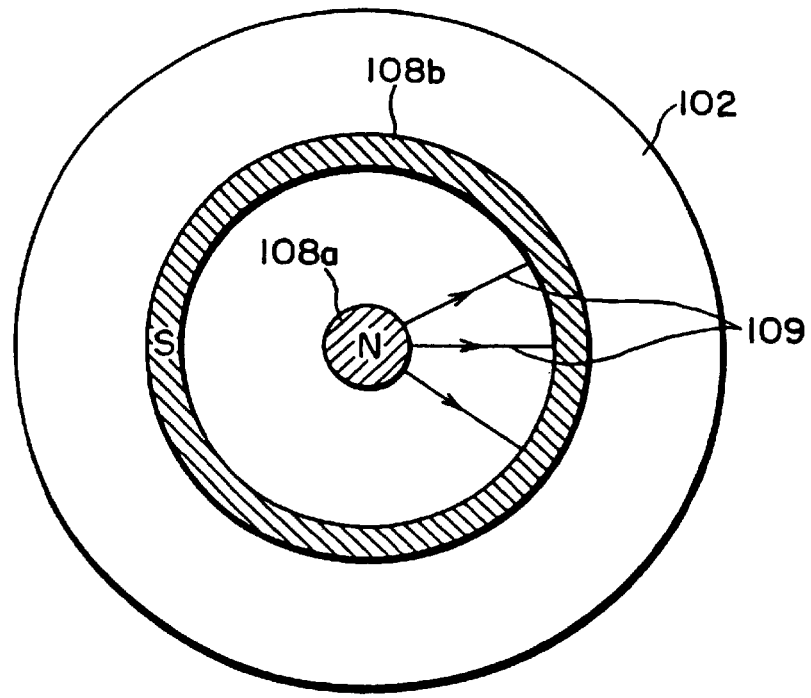
FIG. 11 is a top view of the upper electrode shown in FIG. 10.
Figure 12:
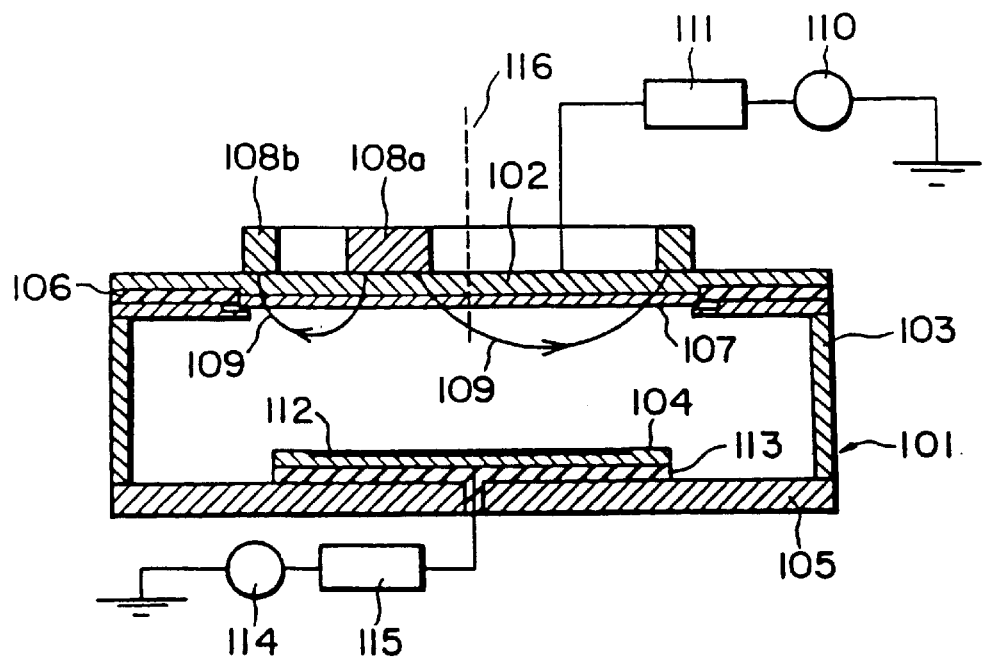
FIG. 12 is a schematic view showing the second conventional plasma source used for plasma processing.
Figure 13:
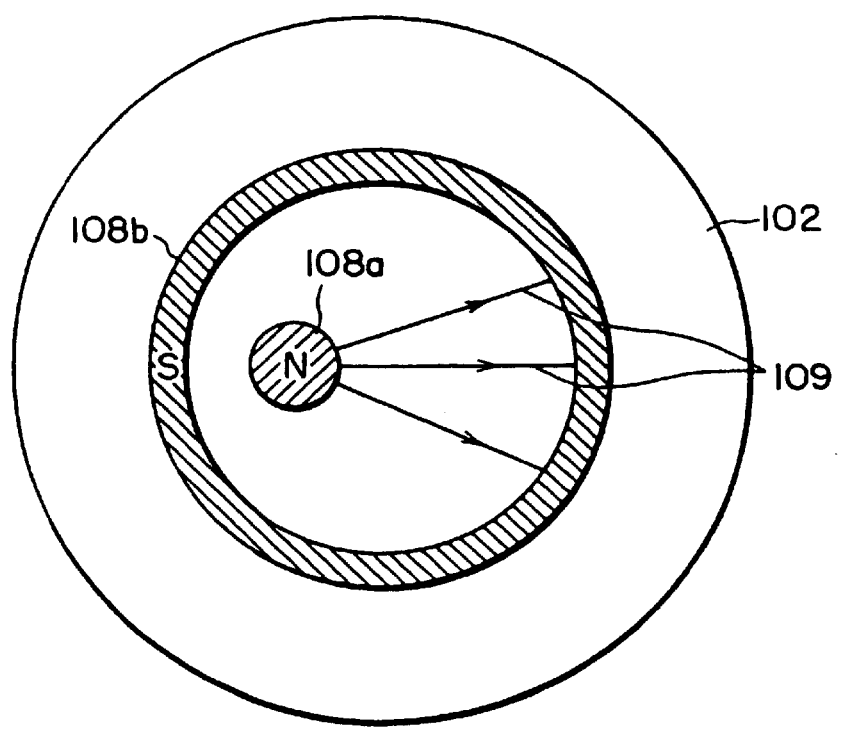
FIG. 13 is a top view of the upper electrode shown in FIG. 12.

Next, the fifth embodiment of the present invention is explained in accordance with FIG. 9. The hardware configuration of this embodiment is the same as that of the above-mentioned embodiments. This embodiment also has a special feature in the respect of the magnetic arrangement above the upper electrode. Therefore, FIG. 9 shows only the magnetic arrangement.

Many magnets 71 are arranged on the corners of hypothetical squares 72 with alternate polarity. The outer diameter of the magnetic arrangement region 73 is approximately equal to the diameter of the upper electrode 11. The magnets 71 are placed only within the region covered by radii r1 and r2 as shown in FIG. 9. The diameter and height of the magnet 71 are not critical. The diameter may lie in the range of 5 mm to 30 mm and the height may vary from 4 mm to 30 mm. The separation between two magnets 71 is also not critical and can be changed in the range of 15 mm to 40 mm. The plurality of magnets 71 are fixed to the above-mentioned metal ring 22 and rotated as explained in the first embodiment.

When the magnets 71 are arranged as explained above, point cusp magnetic fields are generated below the target plate 18. Because of these magnetic fields, plasma density increases as explained in the first embodiment. Therefore, this magnet arrangement also yields uniform film deposition over the entire substrate surface as explained in the first embodiment.

Each of the magnets described in the above-mentioned examples, which is placed on the upper electrode in radial line, is preferably consisted of several magnet elements or made as a single piece. In addition, the width of each magnet that exists on the radial line can be varied in the radial direction.

The plasma processing system in accordance with the present invention can yield a uniformly distributed large area high-density plasma over the surface of the substrate based on independent control of ion density and ion energy, because the plural magnets are radially arranged at outer region of the upper electrode and rotated around the central axis of the upper substrate. Further, the re-deposition on the target platen can be prevented by the rotating magnet structure. In addition, since there is a uniform ion flux on the substrate surface, films can be deposited without charge-induced damages to the devices on the substrate.

What is claimed is:

1. A plasma processing system for sputter deposition applications comprising:
   a reactor including parallel capacitively-coupled upper and lower electrodes facing each other across at least a portion of the reactor, wherein a substrate to be processed is loaded on said lower electrode and a target member is arranged at a lower side of said upper electrode;
   AC electric power sources for respectively supplying AC electric power to said upper electrode and said lower electrode;
   plural magnets each having a length larger than a width, and the lengths of said plural magnets are arranged in radial directions in an outer region of said upper electrode; and
   a mechanism for moving said plural magnets around a central axis of said upper electrode.

2. A plasma processing system for sputter deposition applications as claimed in claim 1, wherein an additional DC electric power source is connected to said upper electrode via a low-pass filter that cut off an AC current applied to said upper electrode.

3. A plasma processing system for sputter deposition applications as claimed in claim 1, wherein said upper electrode is made of a non-magnetic metal, and said magnets generate magnetic fields with closed magnetic fluxes near to the inner surface of said upper electrode by alternately changing a magnetic polarity of said magnets facing the inside of said reactor.

4. A plasma processing system for sputter deposition applications as claimed in claim 3, comprising other plural magnets arranged along a circular line surrounding said radially-arranged magnets in order to confine electrons in a peripheral region of plasma.

5. A plasma processing system for sputter deposition applications as claimed in claim 3, wherein said magnets include first magnets with N polarity facing the inside of said reactor, which are of curved shape extending to the boundary of said upper electrode, and second magnets with S polarity facing the inside of said reactor, which are of straight shape, and said first magnets and said second magnets are alternately arranged so that electrons in the plasma within a magnetic line cusp between said first and second magnets are moved radially outward due to E×B drift and then curved and drifted radially inward through said magnetic line cusp.

6. A plasma processing system for sputter deposition applications as claimed in claim 5, wherein said first magnet with N polarity is longer than said second magnet with S polarity.

7. A plasma processing system for sputter deposition applications as claimed in claim 3, wherein said magnets include first magnets with S polarity facing the inside of said reactor, which are of curved shape extending to the boundary of said upper electrode, and second magnets with N polarity facing the inside of said reactor, which are of straight shape, and said first magnets and said second magnets are alternately arranged so that electrons in the plasma within a magnetic line cusp between said first and second magnets are moved radially outward due to E×B drift and then curved and drifted radially inward through said magnetic line cusp.

8. A plasma processing system for sputter deposition applications as claimed in claim 7, wherein said first magnet with S polarity is longer than said second magnet with N polarity.

9. A plasma processing system for sputter deposition applications as claimed in claim 1, wherein said plural magnets are assembled on a circular metal ring to have a small separation between said upper electrode and said magnets.

10. A plasma processing system for sputter deposition applications as claimed in claim 1, wherein said plural magnets are placed directly on said upper electrode.

11. A plasma processing system for sputter deposition applications as claimed in claim 1, wherein each of said magnets is made as a single piece.

12. A plasma processing system for sputter deposition applications as claimed in claim 1, wherein each of said magnets is consisted of several magnet elements.

13. A plasma processing system for sputter deposition applications as claimed in claim 1, wherein width of each of said magnets existing on the radial line is varied in radial direction.

* * * * *